United States Patent [19]

Yamada et al.

[11] Patent Number: 4,870,661
[45] Date of Patent: Sep. 26, 1989

[54] SAMPLE RATE CONVERSION SYSTEM HAVING INTERPOLATION FUNCTION

[75] Inventors: Masahiro Yamada, Kawasaki; Kiyoyuki Kawai, Yokosuka, both of Japan

[73] Assignee: Kabushiki Kaisha Toshiba, Kawasaki, Japan

[21] Appl. No.: 102,569

[22] Filed: Sep. 29, 1987

[30] Foreign Application Priority Data

Sep. 30, 1986 [JP] Japan .................. 61-231840

[51] Int. Cl.$^4$ .......................... H04N 9/80; H04B 1/66
[52] U.S. Cl. .......................... 375/122; 358/13
[58] Field of Search .................. 375/27, 121, 122, 25, 375/29, 30; 370/84; 358/140, 11, 13, 180

[56] References Cited

U.S. PATENT DOCUMENTS

| | | | |
|---|---|---|---|
| 4,302,776 | 11/1981 | Taylor et al. | 358/180 |
| 4,438,452 | 3/1984 | Powers | 358/11 |
| 4,471,381 | 9/1984 | Kasuga et al. | 358/140 |
| 4,609,941 | 9/1986 | Carr et al. | 358/140 |
| 4,636,857 | 1/1987 | Achiha et al. | 358/140 |
| 4,677,483 | 6/1987 | Dischert et al. | 358/140 |

Primary Examiner—Robert L. Griffin
Assistant Examiner—Marianne Huseman
Attorney, Agent, or Firm—Cushman, Darby & Cushman

[57] ABSTRACT

A first digital data processing system outputs digital data obtained by sampling, in response to a clock signal of a first frequency, original data having a characteristic enabling interpolation thereof. A second digital data processing system obtains output data by sampling input data in response to a clock signal of a second frequency. A sample rate conversion circuit receives the digital data from the first digital data processing system, converts the sample rate thereof into a sample rate suitable for the second digital data processing system, and supplies the sample rate as the input data to the second digital data processing system. The sample rate conversion circuit includes an interpolation circuit for performing interpolation of two adjacent units of data of the digital data received from the first digital data processing system, and an interpolation coefficient calculation circuit for calculating an interpolation coefficient, which is subsequently supplied to the interpolation circuit in accordance with a phase relationship between the clock signals of the first and second frequencies.

10 Claims, 10 Drawing Sheets

| ---- | I | Q | -I | -Q | I | ---- |
FIG. 3
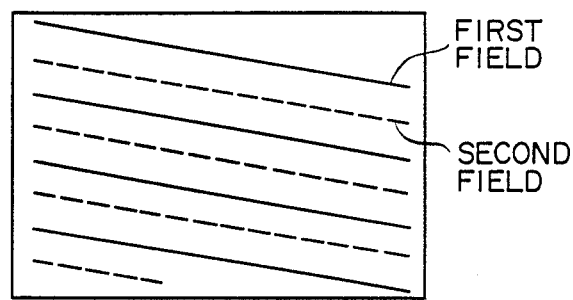
FIG. 4
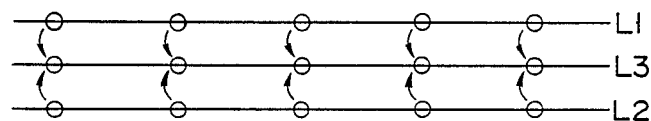
FIG. 5
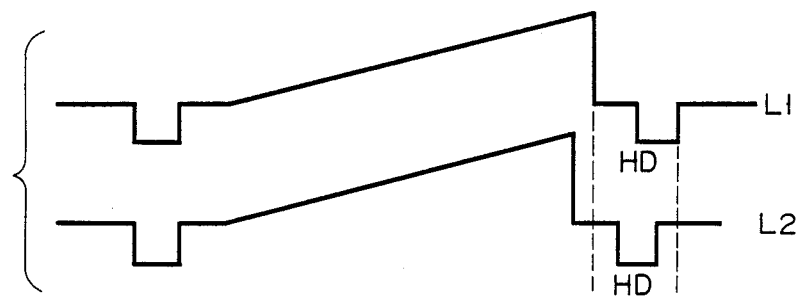
FIG. 6

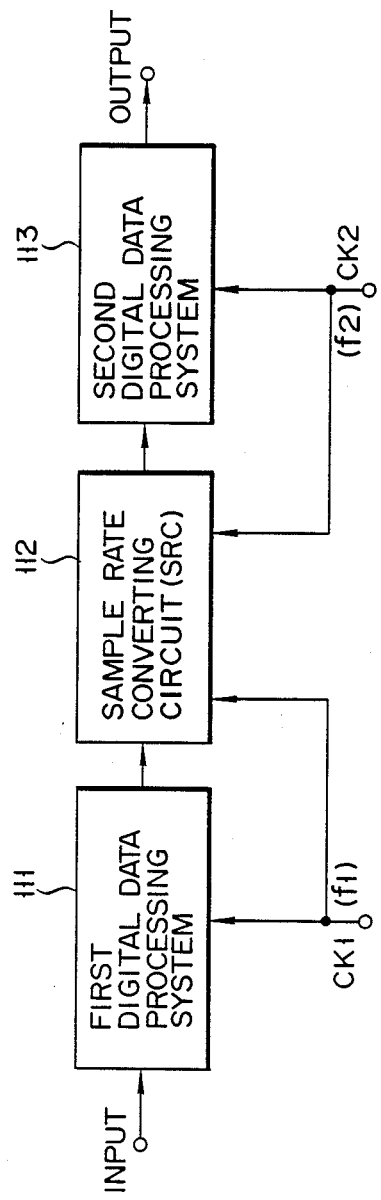
F I G. 10
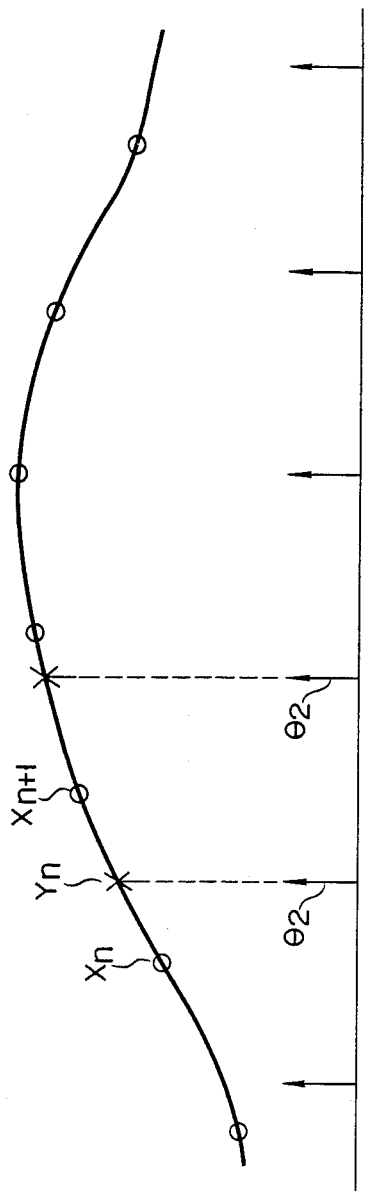
F I G. 11

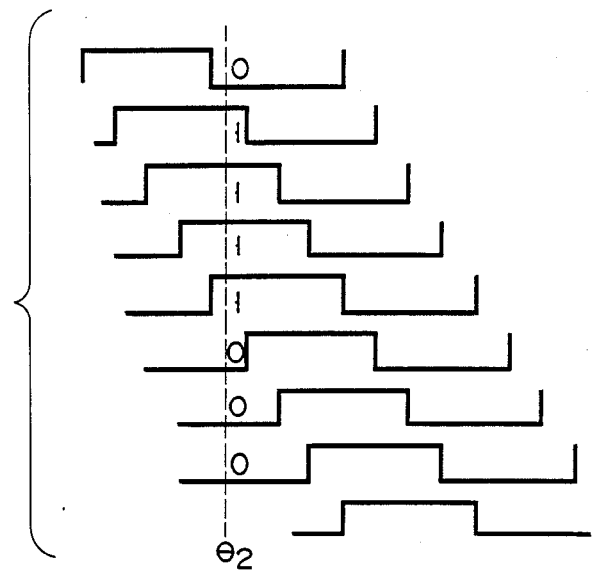
F I G. 13
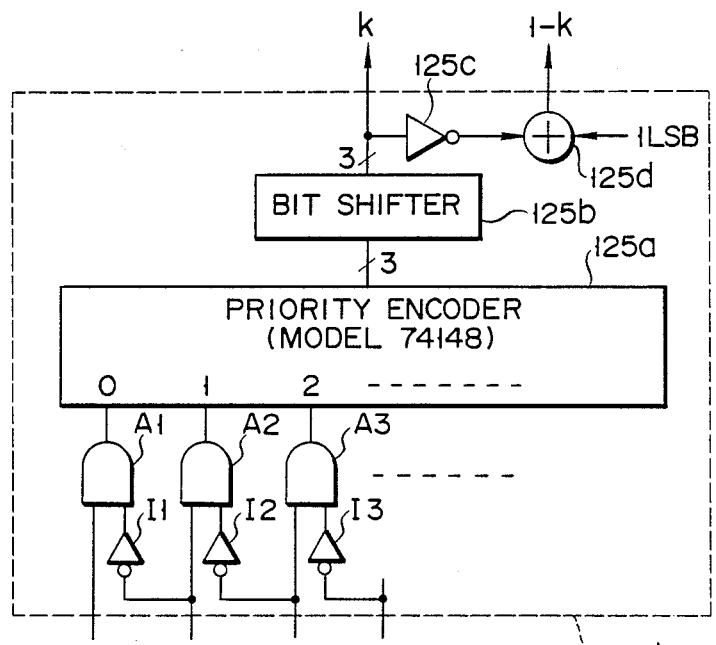
F I G. 14

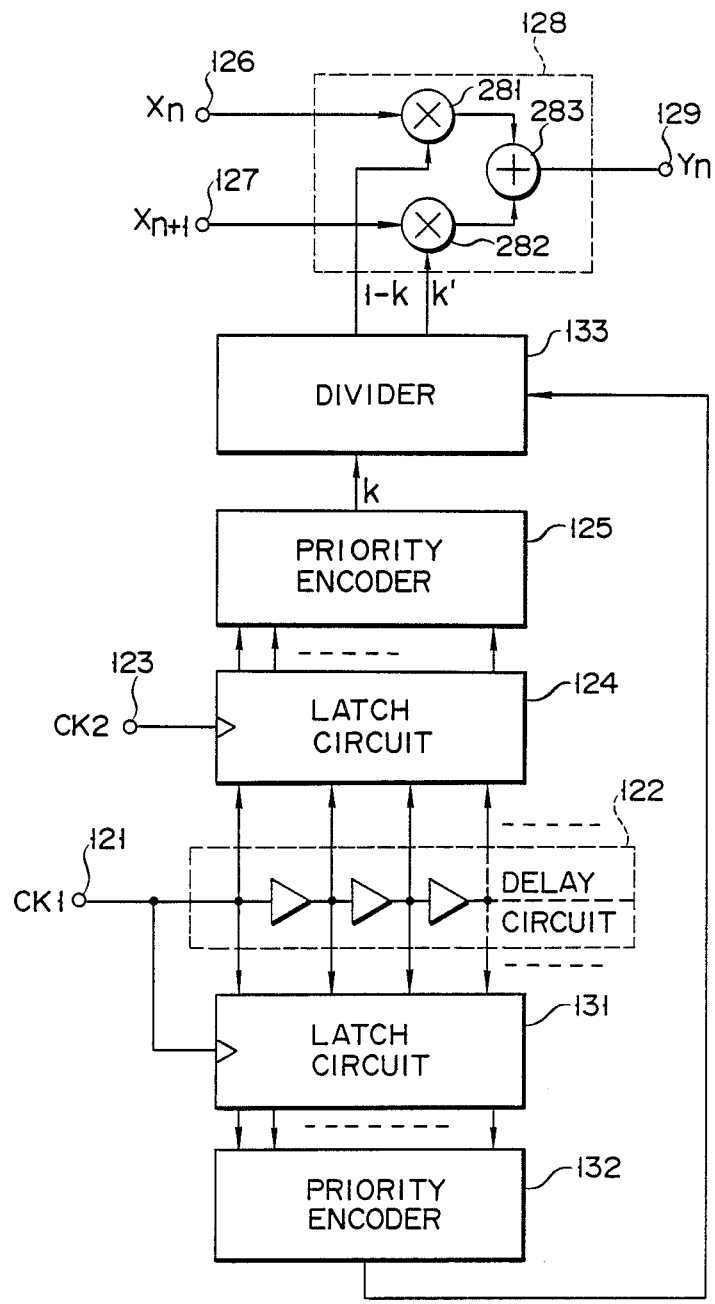
F I G. 15

SAMPLE RATE CONVERSION SYSTEM HAVING INTERPOLATION FUNCTION

BACKGROUND OF THE INVENTION

This invention relates to a sample rate conversion system having an interpolation function and, more particularly, to a sample rate conversion circuit (to be referred to hereinafter as an SRC) for converting first digital data having a first clock frequency into second digital data having a second clock frequency, which is suitable for use in a digital data conversion system which can demodulate a television signal by means of digital processing.

In recent times, a technique has been developed for digitally processing a video signal within a television receiver. Development of this technique has taken place because even though a signal processing circuit for performing analog signal processing can be integrated in a single-chip LSI (Large Scale Integrated circuit), the LSI requires a large number of peripheral components and some of these components must be adjusted, thus making it difficult to reduce the price of the circuit. In order for image quality to be improved, a memory for delaying the video signal must be provided, and various filtering operations must be performed. In this regard, a digital circuit can more precisely and stably perform such processing than can an analog circuit. A signal processing section is effective in a digital circuit for separating a composite video signal into a luminance signal and chrominance signals, and demodulating these signals in a digital circuit.

With the NTSC scheme, a chrominance signal is quadrature-modulated by a chrominance subcarrier of frequency fsc. The chrominance subcarrier of fsc is phase-inverted for every line (every scanning line), and a difference between adjacent scanning lines can be calculated, to separate a modulated signal from a composite color video signal. The modulated signal is then synchronously detected by the chrominance subcarrier of fsc, so as to demodulate a chrominance signal.

In order to demodulate a quadrature-modulated signal, the SIN component and the COS component of the carrier are multiplied together to obtain a demodulated output. If sampling is performed using 4fsc clocks in accordance with the digital scheme, the demodulated output can then be obtained by means of simple filtering processing. Therefore, in the case of a system for obtaining demodulated outputs of I- and Q-axes, the use of the 4fsc clocks is very important.

In the case where a color video signal is processed digitally, scanning line interpolation can then be advantageously performed. When the NTSC scheme is utilized, a 2:1 interlacing scheme is employed, in which scanning lines for one image are thinned out and then transmitted. While this scheme is advantageous as regards compressing a transmission it does, however, result in degradation of image quality—the so-called interlace problem. A typical example of such image quality degradation is the occurrence of line flickering, where a still image flickers vertically. This can be prevented by use of scanning line interpolation where, more specifically, the thinned-out scanning lines are interpolated so that an image is reproduced and displayed as a so-called non-interlacing scheme, thereby preventing flickering. Scanning line interpolation, requires the use of a two- or three-dimensional filter. Such a filter can be operated more easily by the digital technique, than by the analog technique.

When sampling is performed using the 4fsc clocks, as described above, the number of clocks required for sampling a 1H (one horizontal scanning period) signal is 910 in the case of the NTSC video signal. In other words, for proper scanning line interpolation to be performed, in this instance, 910 clocks must always be present during one horizontal scanning period. For this purpose, a 910 fh (fh indicates a horizontal frequency) clock generator is used, and improvements to the generator must be carried out so that the oscillation frequency of the generator can be changed to follow a horizontal sync signal.

As has been described above, clocks of frequency 4fsc are necessary in order to demodulate chrominance signals, and scanning line interpolation requires clocks of a frequency of 910 fh. Therefore, in order that a system can be provided which can perform both chrominance demodulation and scanning line interpolation by way of digital processing, independent digital processing sections must be arranged in accordance with differences in the respective clock frequencies.

If a system is to be created which can perform both the above-mentioned chrominance demodulation and scanning line interpolation by means of a series of processing steps, this requires at a minimum, the provision of a D/A converter and an A/D converter each of a different clock frequency, i.e., as a 4fsc clock system and as a 910 fh clock system, which results in a system of high cost. When D/A conversion and A/D conversion are performed sequentially, this may degrade signals to be converted. In addition, since separate circuits are required for three systems, i.e., luminance, I-axis, and Q-axis components, this further increases the system cost.

Therefore, as regards a digital television receiver which demodulates digital video data, then reproduces and displays demodulated digital, video data, there is an urgent requirement for the development of an inexpensive system in which signal degradation does not occur. For a system to be realized which fulfills the above requirement, it is necessary that independent digital processing sections not be arranged depending on differences in individual clock frequencies, but instead be directly coupled digitally and use signals of the same operating frequency so as to exchange data.

The digital data sampling rate must be converted so as to allow direct data exchange between the two digital data processing systems having different operating frequencies. In order that sample rate conversion can be executed properly, however, a technique suitable for processing digital data of specific properties must be employed.

SUMMARY OF THE INVENTION

It is, therefore, an object of the present invention to provide a new and improved sample rate conversion system having an interpolation function in which two processing circuits having different clock frequencies can be digitally coupled without passing D/A and A/D conversion processing channels, the cost of the system can be reduced, and degradation in signals can be minimized.

A sample rate conversion system having an interpolation function according to the present invention comprises:

a first sampling system, for outputting digital data obtained by sampling, in response to a clock signal of a first frequency, original data having a characteristic enabling interpolation thereof;

a second sampling system, for obtaining output data by sampling input data, in response to a clock signal of a second frequency; and sample rate conversion means for receiving the digital data from the first sampling system, converting a sample rate of the digital data into a sample rate suitable for the second sampling system, and supplying the sample rate, as the input data, to the second sampling system, the sample rate conversion means comprising interpolation means for performing interpolation of two adjacent units of data of the digital data received from the first sampling system, and interpolation coefficient calculation means for calculating an interpolation coefficient, which is subsequently supplied to the interpolation means, in accordance with a phase relationship between the clock signals of the first and second frequencies.

BRIEF DESCRIPTION OF THE DRAWINGS

These and other objects and features of the present invention can be understood through the following embodiments by reference to the accompanying drawings, in which:

FIGS. 1 to 9 show the principal part of a digital television receiver to which the present invention is applied, in which FIG. 1 is a diagram showing the arrangement of a chrominance demodulation circuit, FIG. 2 is a view showing frequency spectra of a television signal, FIG. 3 is a view showing a demodulated chrominance signal output, FIG. 4 is a view for explaining scanning lines of a television signal, FIG. 5 is a view for explaining scanning line interpolation, FIG. 6 is a view for explaining flickering of a television signal, FIG. 7 is a view for explaining scanning line interpolation of a jittered television signal, FIG. 8 is a view for explaining time-base correction in the case of scanning line interpolation, and FIG. 9 a diagram showing an arrangement of a conventional digital television signal processing circuit; and FIGS. 10 to 17 are views in association with a sample rate conversion circuit according to the present invention, in which FIG. 10 is a block diagram schematically showing the conversion circuit, FIG. 11 is a view for explaining the operating characteristics, FIG. 12 is a block diagram showing a first embodiment, FIG. 13 is a view showing the operating state of FIG. 12, FIG. 14 is a view showing in detail a part of FIG. 12, FIG. 15 is a block diagram showing a second embodiment, FIG. 16 is a view for explaining a latch time of FIG. 15, FIG. 17 is a view showing in detail a part of FIG. 15.

DETAILED DESCRIPTION OF THE PREFERRED EMBODIMENTS

Figure 1:
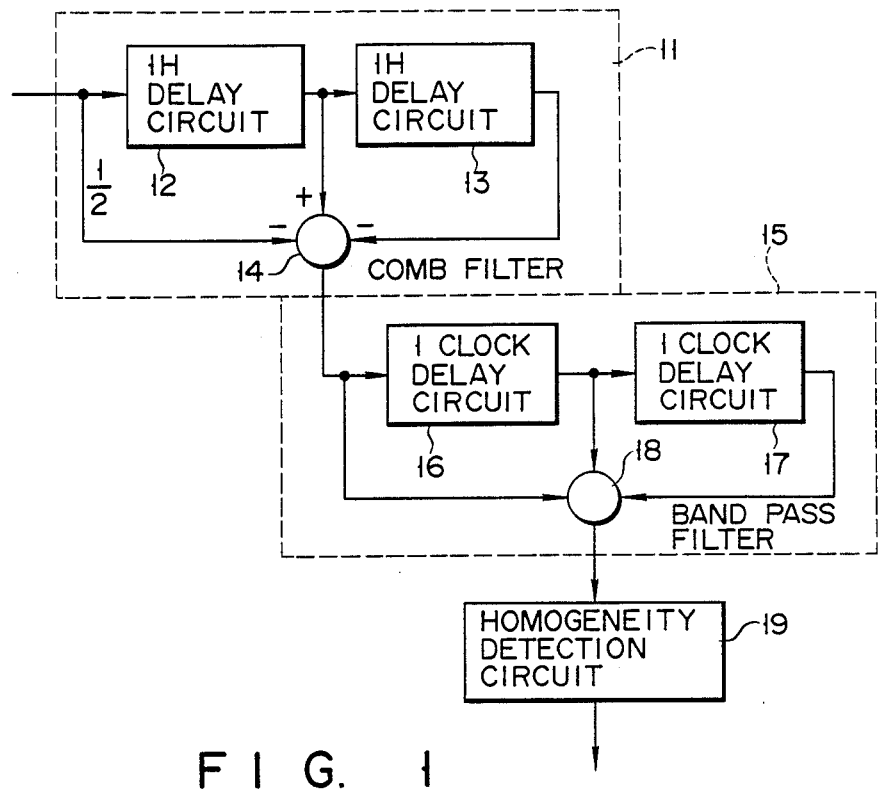

FIG. 1 shows a system for demodulating the NTSC composite color video signal obtained by multiplexing a chrominance signal component and a luminance signal component.

Figure 2:
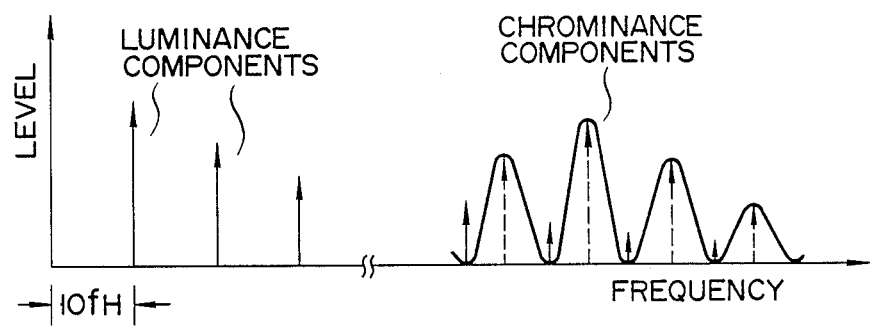

When a digital composite color video signal is supplied to digital comb filter 11 through an A/D converter (not shown), a modulated chrominance signal is output from filter 11. Comb filter 11 comprises one horizontal period (to be referred to as 1H hereinafter) delay circuits 12 and 13, and adder 14, and can separate and extract the modulated chrominance signal by utilizing the fact that frequency positions of spectra of luminance and chrominance signal components are shifted from each other (see FIG. 2). The modulated chrominance signal is supplied to band-pass filter 15, and is extracted as a modulated chrominance signal in a predetermined band. Band-pass filter 15 comprises 1 clock delay circuits 16 and 17, and adder 18, and removes a low-frequency component from the signal extracted by filter 11. In the resultant chrominance signals, when the NTSC signal is sampled at a 4fsc clock while being phase-locked with an I axis, I- and Q-axis components alternately appear in the sampled data, as shown in FIG. 3. The signal is supplied to homogeneity detection circuit 19 to alternately extract I and Q components. In this manner, the signal is synchronously detected, and a chrominance signal can be obtained.

FIGS. 4 and 5 are views for explaining scanning line interpolation processing of a digital television receiver. Scanning lines of a first field transferred by the interlacing scheme are indicated by solid lines, and scanning lines of second field are indicated by dotted lines. When interpolation is performed, adjacent scanning lines L1 and L2 are utilized to form scanning line L3 therebetween, thereby doubling the number of scanning lines. The result scanning line signal can improve image quality since a frame is scanned at a frequency twice a normal one and is displayed. In order to perform interpolation of scanning lines, a line memory is required. However, if digital processing is performed, interpolation can be relatively easily achieved.

A clock in the case of digital interpolation will be considered below. FIG. 6 shows first and second scanning lines L1 and L2. As can be understood from FIG. 6, when interpolation is performed using these scanning lines, sampling points are preferably present at the same horizontal positions when both scanning lines L1 and L2 are viewed from the vertical direction.

Jitter often occurs in the horizontal sync component of a signal reproduced from a home video tape recorder (to be referred to as a VTR hereinafter). More specifically, sync signals HD are often shifted along the time base, as shown in FIG. 6. This is caused by a mechanical factor in a rotating system of the VTR or expansion or shrinkage of a tape itself, and a reproduced signal varies along the time base. In a conventional television receiver, an image of the jittered signal can be normally reproduced since a horizontal deflection circuit performs horizontal scanning of a cathode-ray tube automatically in synchronism with a horizontal sync signal. In other words, horizontal deflection scanning is performed to follow the horizontal sync signal.

Figure 7:
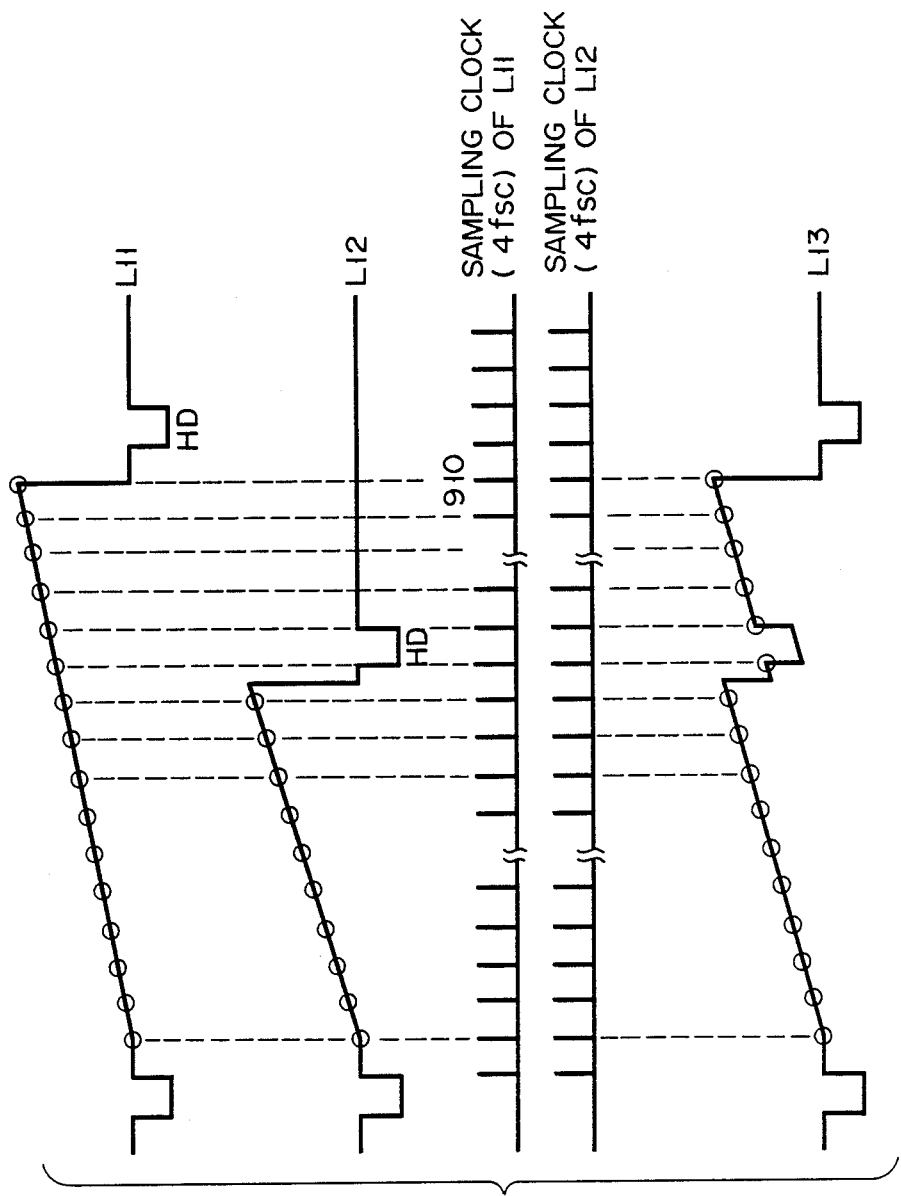

However, when a signal varying along the time base as shown in FIG. 6 is sampled by a very stable 4fsc clock generated from a quartz oscillator, sampling positions are drifted for every line, and interpolation with correct vertical correlation cannot be expected. This phenomenon will be described below with reference to FIG. 7.

Assuming that scanning line signal L11 is a signal free from jitter, scanning line signal L12 is a jittered signal, and points indicated by hollow circles are sampling points. Entire jittered scanning line signal L12 (in this case, the period of the signal is shortened) is sampled by clocks less than 910 clocks necessary for sampling a 1H signal, as described above. Therefore, the number of sampled data stored in a memory is smaller than 910. When scanning line interpolation is performed using the sampled data, and data obtained by sampling a signal free from jitter like scanning line signal L11, interpolated data represented by interpolated scanning line signal L13 is obtained, and cannot have a normal signal waveform.

Figure 8:
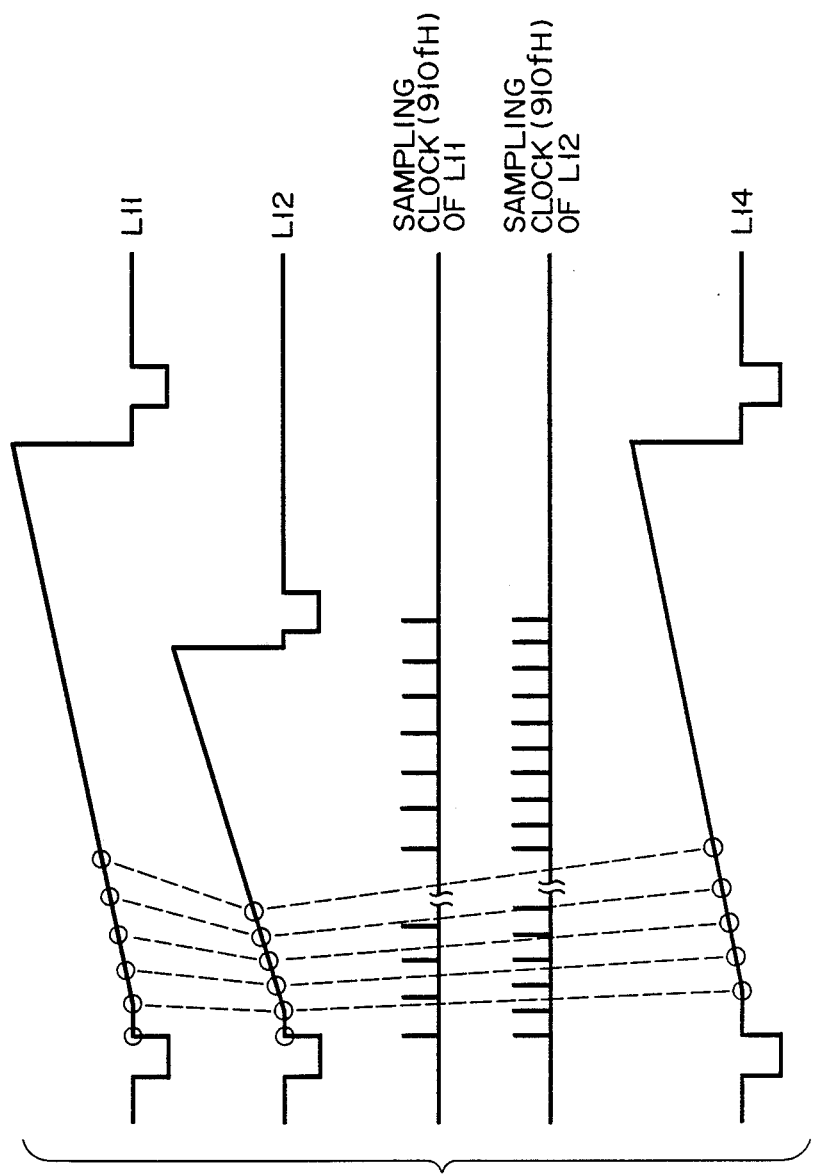

FIG. 8 shows sampling positions and interpolated scanning line signal L14 when the sampling clock frequencies of scanning line signals L11 and L12 are changed to follow a horizontal sync signal.

Figure 9:
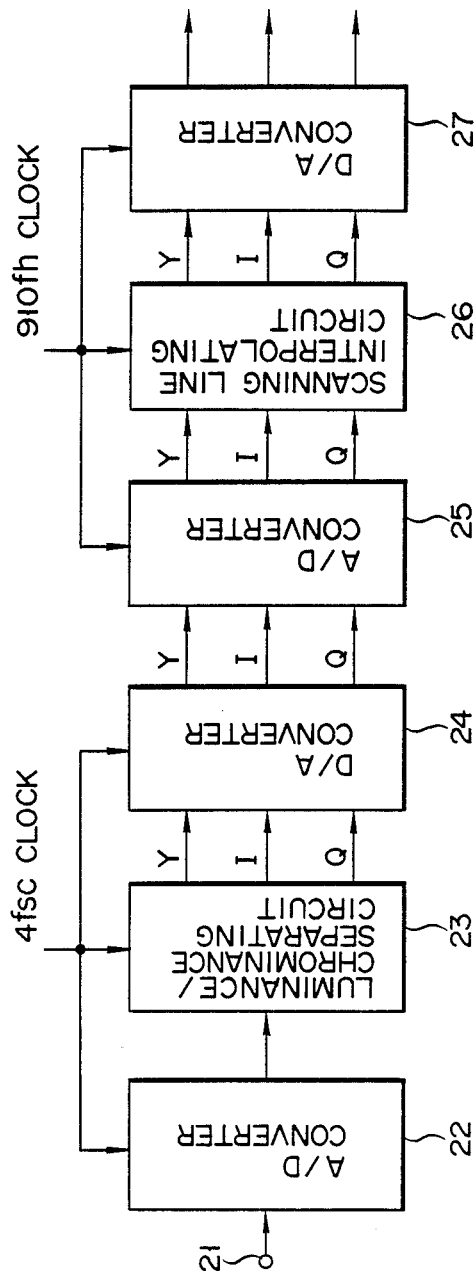

FIG. 9 shows a conventional digital processing system in which a clock generator of frequency 910 fh is adopted so that 910 clocks are present in the 1H period and that the oscillation frequency of this generator is changed to follow the horizontal sync signal. Referring to FIG. 9, the NTSC composite color video signal is input to A/D converter 22 through input terminal 21, and is converted to a digital signal. The digital video signal is input to luminance/chrominance separating circuit 23. Luminance/chrominance separating circuit 23 demodulates I- and Q-axis components as described above with reference to FIG. 1, and also demodulates luminance signal component Y. The I- and Q-axis components and luminance signal component Y are supplied to D/A converter 24. D/A converter 24, A/D converter 22, and luminance/chrominance separating circuit 23 constitute a clock system of frequency 4fsc. The respective demodulated signal components are input to A/D converter 25 and are converted to digital signal components. These digital signal components are input to scanning line interpolating circuit 26 and are subjected to scanning line interpolation. The scanning line interpolated signal components are input to D/A converter 27 and are converted to analog signal components to be supplied to a color receiver. A/D converter 25, scanning line interpolating circuit 26, and D/A converter 27 constitute a clock system of frequency 910 fh.

In the conventional system described above, two processing circuits having different clock frequencies are coupled through D/A and A/D conversion channels having different clock frequencies, resulting in high cost and a cause of signal degradation. Therefore, this reveals the effectiveness of a sample rate conversion system with which two digital processing systems are directly coupled to exchange data, and factors of signal degradation can be eliminated.

A sample rate conversion system according to the present invention which can satisfy the above requirement will now be described.

FIG. 10 schematically shows a sample rate conversion system according to the present invention. Referring to FIG. 10, reference numeral 111 denotes a first digital data processing system for processing input data in accordance with clock signal CK1 of frequency f1; and 113, a second digital data processing system for processing input data in accordance with clock signal CK2 of frequency f2 different from frequency f1. Reference numeral 112 denotes a sample rate conversion system (SRC) as the characteristic feature of the present invention, which converts a sample rate of data output from first digital data processing system 111 into a rate suitable for data processing in second digital data processing system 113.

When the first digital data processing system is applied to, e.g., the digital television receiver as described above, it comprises an A/D conversion section for A/D converting an analog composite color video signal, a luminance/chrominance separating circuit for performing luminance/chrominance processing necessary for the A/D converted signal, and a line memory for storing Y, I, and Q data separated by the above processing.

The respective circuit components of first digital data processing system 111 process input data using clock signal CK1 having frequency 4fsc as f1, and output digital data of a 4fsc rate as a system output. In this application, second digital data processing system 113 comprises a scanning line interpolating circuit for processing input data using clock signal CK2 having a frequency of 910 fH as f2, and a D/A conversion section for D/A converting scanning line interpolated data.

The operation principle of SRC 112 will now be described with reference to FIG. 11. Reference symbols Xn and Xn+1 denote Xnth and (Xn+1)th data output from first digital data processing system 111. Data Xn and Xn+1 are synchronized with clock signal CK1. In order to supply these data to system 113 which is operated in response to clock CK2, data Yn can be obtained at a timing of phase $\theta_2$ of clock signal CK2, and supplied to system 113. For this purpose, data Xn and Xn+1 can be linearly interpolated. This interpolation coefficient can be obtained by obtaining the phase relationship between clock signals CK1 and CK2.

Figure 12:
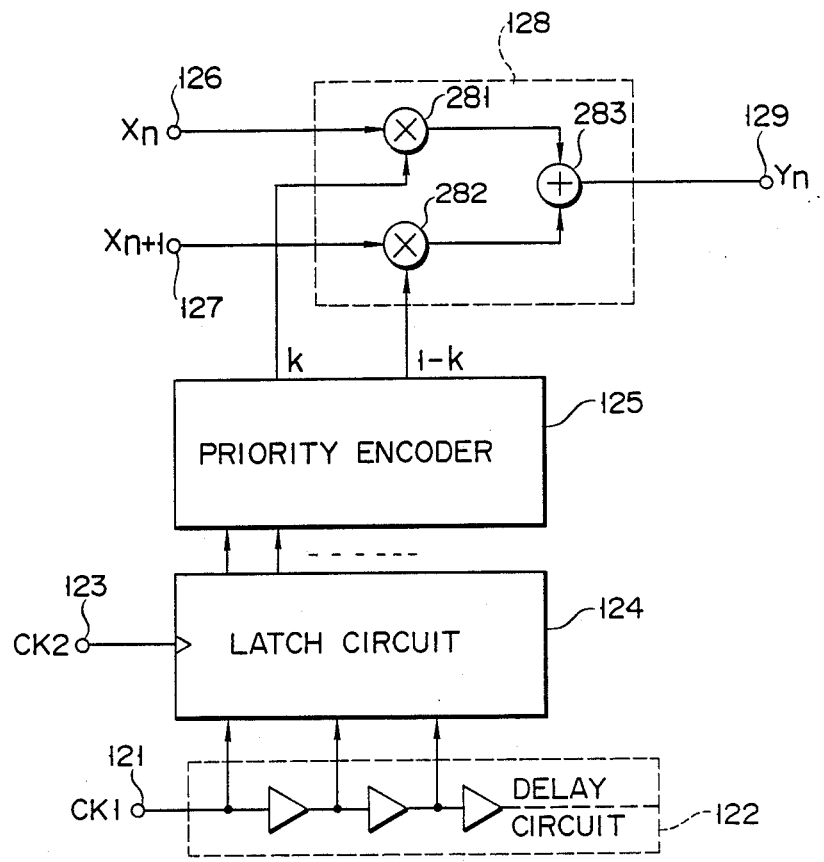

FIG. 12 is a circuit diagram showing in detail SRC 112 according to the first embodiment of the present invention. Referring to FIG. 12, clock CK1 supplied to terminal 121 is delayed by delay circuit 122 comprising eight cascade-connected gates. Thus, as shown in FIG. 13, nine phases of delayed clock signals including clock signal CK1 can be obtained. The nine phases of delayed clock signals are latched by latch circuit 124 in response to clock signal CK2 supplied to terminal 123.

Assuming that phase $\theta_2$ of clock signal CK2 is as shown in FIG. 13, the latch data in latch circuit 124 is "01111000". Priority encoder 125 retrieves bits corresponding to pattern "10" from the latch data, thereby obtaining the interpolation coefficient. In the case of FIG. 13, "1" of pattern "10" is present at the fifth bit position of the output bits from latch circuit 124, and "0" is present at the sixth bit position. Thus, interpolation coefficients ⅝ (=k) and ⅜ (=1−k) can be obtained. More specifically, each interpolation coefficient is obtained as a ratio of a time interval between data Xn and clock signal CK2 to a time interval between data Xn+1 and clock signal CK2.

Interpolation coefficient k is supplied to multiplier 281 of variable filter 128, and is multiplied with data Xn input from terminal 126. Meanwhile, interpolation coefficient 1−k is supplied to multiplier 282 and is multiplied with data Xn+1 input from terminal 127. These products are added by adder 283, and the sum is output to terminal 129 as data Yn [=kXn+(1−k)Xn+1].

FIG. 14 shows in detail priority encoder 125. More specifically, the bit outputs of latch circuit 124 are supplied to versatile priority encoder 125a (e.g., MODEL 74148) sequentially through AND gates A1, A2, ..., and inverters I1, I2, ... The output from encoder 125a (in this case, 3 bits) is output through bit shifter 125b as interpolation coefficient k, and an output from shifter 125b is supplied through inverter 125c to adder 125d for performing addition with 1LSB. The output from adder 125d is output as interpolation coefficient 1−k. The table below shows combinations of interpolation coefficients k and 1−k when the number of stages of gate is 8.

| k | 1-k |
|---|---|
| 0 | 1 |
| 0.125 | 0.875 |
| 0.25 | 0.75 |
| 0.375 | 0.625 |
| 0.5 | 0.5 |
| 0.625 | 0.325 |
| 0.75 | 0.25 |
| 0.875 | 0.125 |

As described above, SRC 112 of FIG. 12 effects the sample rate conversion function by linear interpolation. SRC 112 is arranged to digitally directly couple between first and second digital data processing systems 111 and 113 having different operating frequencies, thus allowing data exchange therebetween. As a result, the arrangement can be simpler than the conventional system, and this can contribute to a reduction in cost. In addition, signal degradation factors can be eliminated. This can contribute to prevalence of digital television receivers as described above.

In the above arrangement, the relationship between a gate delay time and the clock frequency must satisfy the requirement as follows. Clock signal CK1 supplied from terminal 121 is delayed by just one period when it has passed 8 gates. However, since the gate delay time is unstable, the interpolation coefficients cannot be correctly calculated by the above arrangement. In particular, in FIG. 11, when phase θ approximates data Xn, errors of interpolation coefficients k and 1−k are increased. In the above description, bits appearing as pattern "10" may be shifted toward the MSB when a delay amount of the gates is decreased. When phase θ comes closer to data Dn+1, the above bits are out of the 8th bit position, and the interpolation coefficient cannot be obtained.

In the SRC of the first embodiment as described above, if a delay time of the delay gates varies, a correct interpolation coefficient may not often be obtained. Therefore, the second embodiment of the present invention has as its object to provide an SRC which can precisely obtain an interpolation coefficient even if the delay time of the delay gates varies.

The features of this embodiment will be described first. In order to achieve the above object, according to the second embodiment of the present invention, in addition to an arrangement for latching multiphase delayed outputs of a clock signal before conversion by a clock signal after conversion and obtaining an interpolation coefficient from the latch output, the multi-phase delayed outputs are latched by the clock signal before conversion, the phase relationship between the clock signal before conversion and the multi-phase delayed outputs is detected from the latch output, and the interpolation coefficient is corrected in accordance with the detection result. With the above arrangement, even if a delay time of the delay gates varies, since the interpolation coefficient can be corrected in accordance with the variation, a correct interpolation coefficient can always be obtained.

The second embodiment of the present invention will be described hereinafter in detail with reference to the accompanying drawings.

FIG. 15 is a circuit diagram showing the arrangement according to the second embodiment of the present invention. The same reference numerals in FIG. 15 denote the same parts as in FIG. 12.

Referring to FIG. 15, multi-phase delayed clock signals output from delay circuit 122 are latched by another latch circuit 131 in response to clock signal CK1. The latch output is supplied to another priority encoder 132. Priority encoder 132 detects bits corresponding to pattern "10" from the input data, thereby detecting a relative phase between clock signal CK1 and multi-phase delayed clock signals.

The detection output from encoder 132 is supplied to divider 133. Divider 133 also receives interpolation coefficient k calculated by encoder 125. Divider 133 divides interpolation coefficient k in accordance with the detection result of encoder 131. If the division result is given as k', divider 133 further calculates 1−k', and supplies k' and 1−k' as regular interpolation coefficients to multipliers 281 and 282.

In the above arrangement, if the delay time of the gates of delay circuit 122 varies, the relative phase between clock signal CK1 and multi-phase delayed clock signals varies. Therefore, in latch circuit 131 for latching the multi-phase delayed clock signals by clock signal CK1, the deviation of the delay amount can be latched. The latched deviation is detected by encoder coefficient k output from encoder 125 is 132 as the deviation of the relative phase. Interpolation divided by the detection result, so that the coefficient can be normalized, and interpolation coefficient k' free from the variation of the delay amount can be obtained.

Latching the multi-phase delayed clock signals by latch circuit 131 by clock signal CKI before conversion is equivalent to latching the multi-phase clock signals at the output timing of data Xn+1 shown in FIG. 11. In this case, interpolation coefficient k is set to be 1. Therefore, latching of the multi-phase delayed clock signals by clock signal CK1 means detection of bits corresponding to pattern "10" when interpolation coefficient k is 1.

In latch circuit 131, the bits corresponding to the pattern vary depending on a variation in delay time of the delay gates. However, in latch circuit 124, the bits are fixed regardless of the variation in delay time. Therefore, the output from encoder 125 can be divided by the output from encoder 132, so that the variation in interpolation coefficient k upon a variation in delay time can be corrected.

In FIG. 15, the delay time of the gates constituting delay circuit 122 is the same as that in FIG. 12. However, the number of delay stages is 8 in FIG. 12 while 9 in FIG. 15. This is to make the entire delay amount of delay circuit 122 longer than one period of clock signal CK1 even if the delay time becomes smaller than a normal value. When the delay amount is decreased, pattern "10" will not fall outside the MSB, and interpolation coefficient k' can always be obtained.

Figure 16:
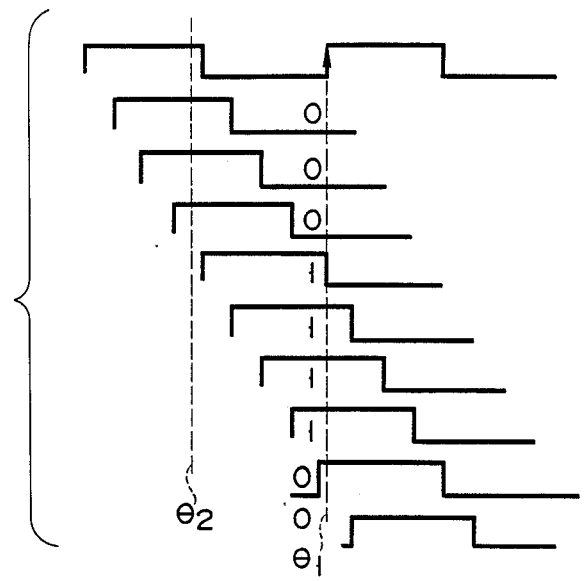

FIG. 16 shows latch timings of latch circuits 124 and 131 with respect to nine phases of delayed clock signals output from delay circuit 122. Latch circuit 131 latches the multi-phase delayed clock signals immediately before phase $\theta 1$ at the edge of clock signal CK1. For this reason, the latch output of latch circuit 131 is "000111100".

Pattern "10" appears at the 7th and 8th bit positions, and a delay time for one period of the clock is longer than that for seven gates, and is shorter than that for eight gates. When nine phases of delayed clock signals are latched by clock CK2, the start position at which pattern "10" appears varies in the range of 1 to 8 in the latch output, and is output from 7.

Divider 133 outputs the following values for values of 1 to 8 as interpolation coefficient k':

1 − ⅛ to 1 − 8/8 and outputs the following values as coefficient (1 − k'):

⅛ to 8/8

In the above description, the case has been exemplified wherein the gate delay amount varies. However, the present invention can be applied to a case wherein the phase of clock signal CK1 varies.

In the above description, one period of clock signal CK1 is equal to an 8-stage delay time of the gates. However, in the second embodiment of the present invention, one period of clock signal CK1 is normally equal to an n-stage delay time (n is a positive integer). When the gate delay time varies, values of (1−1/n) to (1−n/n) as interpolation coefficient k' and values of 1/n to n/n as interpolation coefficient 1−k' may be output. If the second embodiment of the present invention is not employed, the coefficients are (1−1/m) to (1−n/m) and 1/m to n/m (m is a positive integer), and if m=n, interpolation cannot be correctly performed, and hence, a distorted output signal is obtained.

Figure 17:
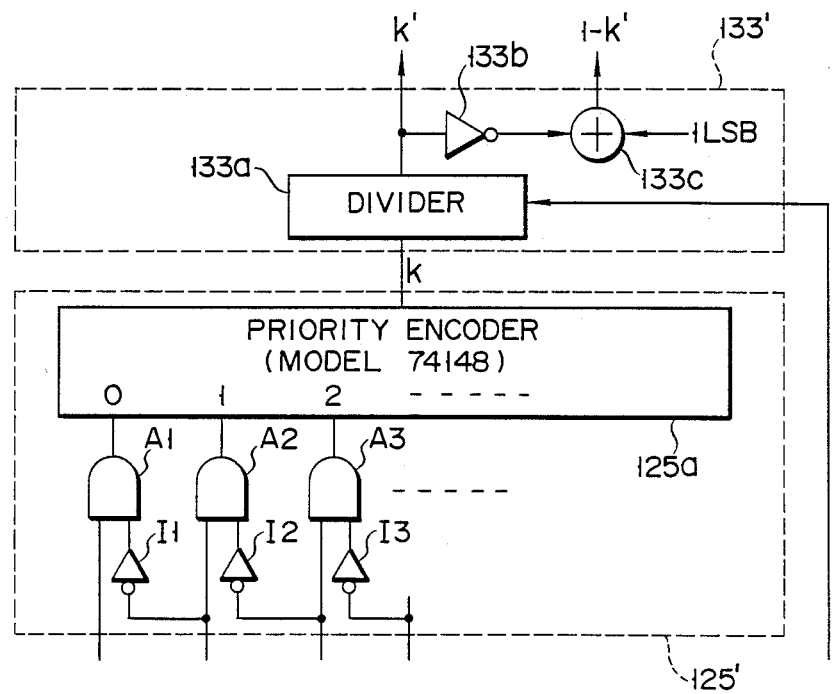

FIG. 17 shows in detail priority encoder 125 and divider 133. More specifically, the output from priority encoder 125' similar to that in FIG. 14 (in this case, 1 bit) is supplied to divider 133a of divider section 133'. The division output from divider 133a is output as interpolation coefficient k', and is also supplied through inverter 133b to adder 133c for performing addition with 1LSB. The output from adder 133c is output as interpolation coefficient 1−k'.

Another priority encoder 132 can have the same arrangement as that of priority encoder 125' shown in FIG. 17.

According to the second embodiment of the present invention, an SRC which can precisely obtain an interpolation coefficient even if the delay amount of the delay gates varies can be provided.

Figure 18:
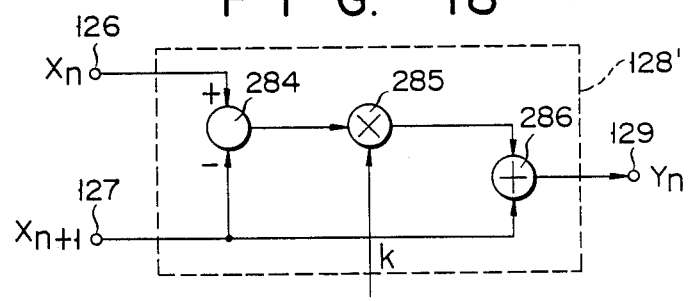
FIG. 18 shows a modification of a part of FIGS. 12 and 15.

Furthermore, variable filter 128 in the first and second embodiments may be used a modified variable filter 128', as shown in FIG. 18. This variable filter 128' comprises operation circuit 284 for causing the difference $(X_n - X_{n+1})$ of the two adjacent units of data $(X_n, X_{n+1})$, multiplier 285 for multiplying the resulting output from operation circuit 284 by interpolation coefficient k (or k'), and adder 286 for adding the resulting output from multiplier 285 and the latter $(X_{n+1})$ of the two adjacent units of data $(X_n, X_{n+1})$. Adder 285 outputs to terminal 129 as data $Y_n$ $[=kX_n+(1-k)X_{n+1}]$, as the same of that FIG. 12.

What is claimed is:

1. A sample rate conversion system having an interpolation function, said system comprising:
    a first sampling system, for outputting digital data obtained by sampling, in response to a first clock signal of a first frequency, original data having a characteristic enabling linear interpolation thereof;
    a second sample system, for obtaining output data by sampling input data, in response to a second clock signal of a second frequency; and
    sample rate conversion means for receiving the first and second clock signals and the digital data from said first sampling system, converting a sample rate of the digital data into a sample rate suitable for said second sampling system, and supplying the sample rate, as the input data, to said second sampling system, said sample rate conversion means comprising interpolation means for performing interpolation of two adjacent units of data of the digital data received from said first sampling system based on an interpolation coefficient corresponding to at least two appropriate data units, and interpolation coefficient calculation means for calculating said interpolation sufficient, which is subsequently supplied to said interpolation means, in accordance with a phase relationship between the second clock signal of the second frequency with respect to the first clock signal of the first frequency.

2. A system according to claim 1, wherein said interpolation is a linear interpolation.

3. A system according to claim 1, wherein said interpolation means comprises a variable filter.

4. A system according to claim 3, wherein said variable filter comprises a first multiplier, for multiplying one of the two adjacent units of data by a first interpolation coefficient, a second multiplier, for multiplying the other one of the two adjacent units of data by a second interpolation coefficient, and an adder for adding the resulting outputs from said first and second multipliers.

5. A system according to claim 3, wherein said variable filter comprises an operation circuit for outputting the difference of the two adjacent units of data, a multiplier for multiplying the resulting output from said operation circuit by an interpolation coefficient, and an adder for adding the resulting output from said multiplier and the latter of the two adjacent units of data.

6. A system according to claim 1, wherein said interpolation coefficient calculation means includes latch means for latching n+1 timing signals obtained by dividing one period of the first clock signal of the first frequency by n, in response to the second clock signal of the second frequency, and priority encoder means for discriminating a relative phase between the first and second clock signals of the first and second frequencies, in accordance with a specific pattern indicated by bit outputs from said latch means, so as to calculate a first interpolation coefficient k and/or a second interpolation coefficient 1−k.

7. A system according to claim 6, wherein said system further includes interpolation coefficient correcting means, which comprises latch means for latching n+1 timing signals obtained by dividing one period of the first clock signal of the first frequency by n, in response to the first clock signal of the first frequency, priority encoder means for discriminating a relative phase between the first clock signal of the first frequency and the n+1 timing signals, in accordance with a specific pattern indicated by bit outputs from said latch means, so as to output an interpolation coefficient correcting signal, and correcting means for correcting the first and second interpolation coefficients, in accordance with the interpolation coefficient correcting signal from said priority encoder means.

8. A sample rate conversion circuit for converting first digital data having a first clock frequency into second digital data having a second clock frequency, different from the first clock frequency, comprising:
   clock signal delay means, including cascade-connected n delay stages, for delaying a first clock signal having the first clock frequency and outputting n+1 delayed clock signals;
   latch means for latching, in response to a second clock signal, the n+1 delayed clock signals output from said clock signal delay means;
   interpolation coefficient calculation means for discriminating a relative phase between the first and second clock signals, in accordance with the latch output from said latch means and the number of delay stages of said clock signal delay means, so as to calculate an interpolation coefficient for converting the first data into the second data by linear interpolation; and
   a variable filter for linearly interpolating the first digital data, in accordance with the interpolation coefficient from said interpolation coefficient calculation means, to obtain the second digital data.

9. A sample rate conversion circuit for converting first digital data having a first clock frequency into second digital data having a second clock frequency, different from the first clock frequency, comprising:
   clock signal delay means, including cascade-connected n delay stages, for delaying a first clock signal having the first clock frequency and outputting n+1 delayed clock signals;
   first latch means for latching, in response to a second clock signal, the n+1 delayed clock signals output from said clock signal delay means;
   interpolation coefficient calculation means for discriminating a relative phase between the first and second clock signals, in accordance with the latch output from said first latch means and the number of delay stages of said clock signal delay means, so as to calculate an interpolation coefficient for converting the first data into the second data by linear interpolation;
   second latch means for latching the n+1 delayed signals in response to the first clock signal;
   relative phase detection means for detecting a relative phase between the first clock signal and the n+1 delayed clock signals in accordance with the latch output from said second latch means and the number of delay stages of said clock signal delay means;
   normalization means for normalizing the calculation output from said interpolation coefficient calculation means, in accordance with the detection output from said relative phase detection means; and
   a variable filter for linearly interpolating the first digital data, in accordance with the normalized output from said normalization means, to obtain the second digital data.

10. A sample rate conversion circuit for converting first digital data having a first clock frequency and consisting of a plurality of data units into second digital data having a second clock frequency different from the first clock frequency, comprising:
    an input terminal for receiving the first digital data;
    interpolation means for performing interpolation of two adjacent units of said first digital data received from said input terminal, based on an interpolation coefficient corresponding to at least two appropriate data units;
    interpolation coefficient generation means for receiving a first clock signal having the first clock frequency and a second clock signal having the second clock frequency and generating said interpolation coefficient, which is subsequently supplied to said interpolation means, in accordance with a plane relationship of the second clock signal with respect to the first clock signal; and
    an output terminal connected to said interpolation means for outputting said second digital data.

* * * * *